(12) United States Patent
Abraham et al.

(10) Patent No.: US 6,724,674 B2
(45) Date of Patent: Apr. 20, 2004

(54) MEMORY STORAGE DEVICE WITH HEATING ELEMENT

(75) Inventors: David W. Abraham, Croton-on-Hudson, NY (US); Philip L. Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 10/128,838

(22) Filed: Apr. 23, 2002

(65) Prior Publication Data

US 2003/0198113 A1 Oct. 23, 2003

(51) Int. Cl.[7] .............................. G11C 7/04; G11C 7/00
(52) U.S. Cl. ...................... 365/211; 365/232; 365/225.5
(58) Field of Search ................................ 365/211, 209, 365/224, 225.5, 232, 171, 97, 55, 66

(56) References Cited

U.S. PATENT DOCUMENTS

| | | | |
|---|---|---|---|
| 5,389,482 A | * 2/1995 | Okano et al. ............. 430/106.2 |
| 5,640,343 A | 6/1997 | Gallagher et al. |
| 5,650,958 A | 7/1997 | Gallagher et al. |
| 5,946,228 A | 8/1999 | Abraham et al. |
| 6,072,718 A | 6/2000 | Abraham et al. |
| 6,088,195 A | * 7/2000 | Kamiguchi et al. .... 360/324.12 |
| 6,104,633 A | 8/2000 | Abraham et al. |
| 6,233,171 B1 | * 5/2001 | Youm et al. ................. 365/158 |
| 6,483,741 B1 | * 11/2002 | Iwasaki et al. ............. 365/170 |
| 6,496,436 B2 | * 12/2002 | Naji ........................... 365/209 |
| 2002/0167059 A1 | * 11/2002 | Nishimura et al. ......... 257/421 |

OTHER PUBLICATIONS

C.C. Williams et al., "Scanning Thermal Profiler," Appl. Phys. Lett. 23, pp. 1587–1589, Dec. 1986.
Mee et al., "Magnetic Recording Handbook," McGraw–Hill, pp. 540–580 (1989).

* cited by examiner

Primary Examiner—Thong Q. Le
(74) Attorney, Agent, or Firm—Ryan, Mason & Lewis, LLP; Wan Yee Cheung, Esq.

(57) ABSTRACT

A memory storage device is provided that includes a storage cell having a changeable magnetic region. The changeable magnetic region includes a material having a magnetization state that is responsive to a change in temperature. The memory storage device also includes a heating element. The heating element is proximate to the storage cell for selectively changing the temperature of the changeable magnetic region of said storage cell. By heating the storage cell via the heating element, as opposed to heating the storage cell by directly applying current thereto, more flexibility is provided in the manufacture of the storage cells.

20 Claims, 6 Drawing Sheets

MEMORY STORAGE DEVICE WITH HEATING ELEMENT

STATEMENT OF GOVERNMENT RIGHTS

This invention was made with Government support under grant contract numbers MDA972-96-C-Z0030 and MDA972-99-C-0009 awarded by the Defense Advanced Research Projects Agency (DARPA) of the United States Department of Defense. The Government has certain rights in this invention.

FIELD OF INVENTION

The present invention generally relates to memory arrays of storage cells, and more particularly to a memory storage device with a heating element.

BACKGROUND OF THE INVENTION

Magnetic Random Access Memory (MRAM) technology utilizes storage cells, for example, magnetic tunnel junctions (MTJs), which generally each have at least two magnetic regions or layers with an electrically insulating barrier layer between them. The data storage mechanism relies on the relative orientation of the magnetization of the two layers, and on the ability to discern this orientation through electrodes attached to these layers. For background, reference is made to U.S. Pat. Nos. 5,650,958 and 5,640,343 issued to Gallagher et al. on Jul. 22, 1997 and Jun. 17, 1997, respectively, which are incorporated herein by reference.

Typically, each storage cell includes a magnetically changeable (reversible) or "free" region and a proximate magnetically referenced "fixed" region arranged into a MTJ. A storage cell can be written by reversing the free region magnetization using applied bi-directional electrical and resultant magnetic stimuli via its respective bit line and word line. The storage cell can later be read by measuring the resultant tunneling resistance between the bit line and word line, which assumes one of two values depending on the relative orientation of the magnetization of the free region with respect to the fixed region.

MRAM arrays typically include an array of data storage cells respectively positioned at intersections of word lines and bit lines. When writing storage cells, it is desirable to write only selected storage cells in the array, without affecting other non-selected cells. However, the magnetic fields generated from the bit and word line during writing can disturb the magnetization state of adjacent non-selected cells, thereby reducing reliability of the array. In addition, the magnetic state of a cell can be affected by the magnetization state of adjacent cells, especially in a dense array.

Accordingly, a need exists for improving the write selectivity of memory storage cells within a memory array.

SUMMARY OF THE INVENTION

The present invention provides techniques for increasing the write selectivity of memory storage cells and reducing the types of errors described above.

In one aspect of the invention, the invention provides a memory storage device. The storage device includes a storage cell having a changeable magnetic region. The changeable magnetic region includes a material having a magnetization state that is responsive to a change in temperature. The memory storage device also includes a heating element. The heating element is proximate to the storage cell for selectively changing the temperature of the changeable magnetic region of said storage cell.

In a preferred embodiment, the storage cell of the memory storage device includes a magnetic tunnel junction, and the changeable magnetic region is a reversible magnetic region having a magnetization state which can be reversed by applying thereto a selected magnetic field. The reversible magnetic region includes a material having a magnetization state that is responsive to a change in the temperature thereof.

Preferably, the magnetic tunnel junction further includes at least one fixed magnetic region having a magnetization state which cannot be changed or reversed by applying the selected magnetic field to the fixed magnetic region.

According to a preferred embodiment of the invention, selective heating is applied to the storage cell by passing an electric current through the heating element. The memory storage device can further include an electrically conductive terminal that is capable of receiving the electric current passing through the heating element.

As will be understood, it may be desirable to maintain the aforesaid reversible magnetic region at the compensation temperature to maintain stored data in the storage cell.

In another aspect of the invention, a memory array is provided. The memory array includes two or more memory storage devices. At least one of the memory storage devices includes a storage cell having a bit line and word line associated therewith. The storage cell includes a changeable magnetic region that includes a material having a magnetization state that is responsive to a change in temperature thereof. The memory storage device also includes a heating element proximate to the storage cell for selectively changing the temperature of said changeable magnetic region of said storage cell.

In another aspect of the invention, an integrated circuit is provided. The integrated circuit includes at least one memory storage device as set forth above and described further herein.

BRIEF DESCRIPTION OF THE DRAWINGS

FIGS. 6(a)–6(c) schematically illustrate the temperature dependence of the coercive field of selected ferrimagnetic materials suitable for use in the magnetic tunnel junction, according to the present invention.

DETAILED DESCRIPTION OF PREFERRED EMBODIMENTS OF THE INVENTION

Figure 1:
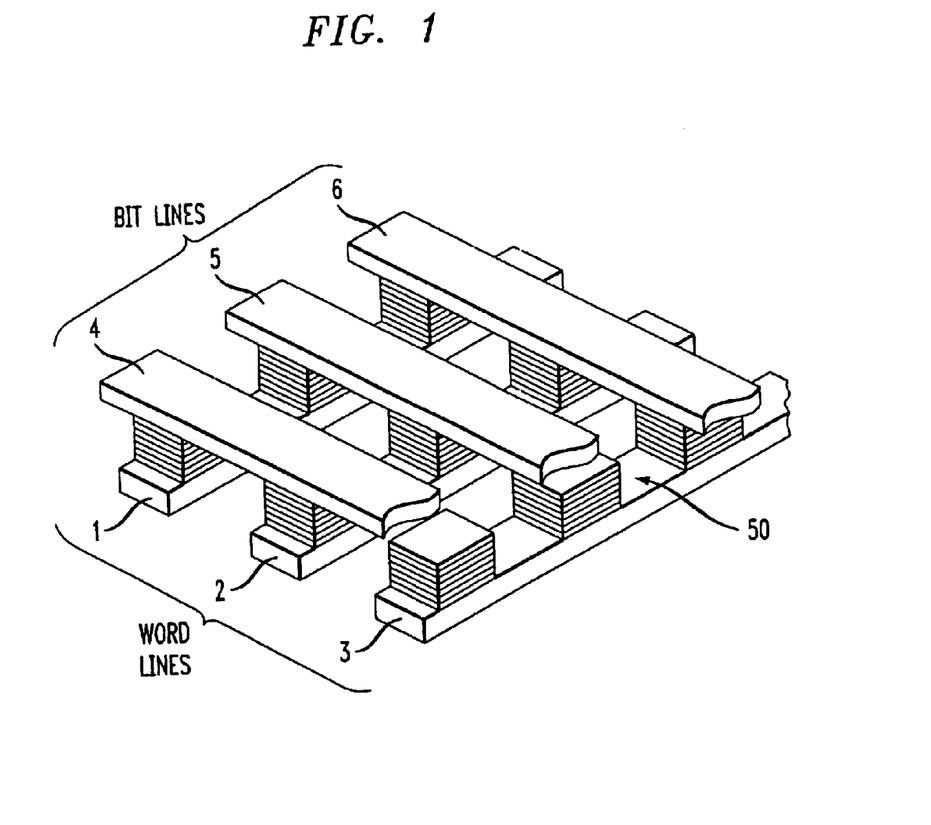
FIG. 1 schematically illustrates a magnetic memory array of MRAM magnetic storage cells suitable for use with the present invention.

MRAM arrays include an array of data storage cells 50 typically positioned at the intersections of wordlines 1, 2, 3 and bitlines 4, 5, 6, as shown in FIG. 1. In a preferred form, each cell includes a magnetically changeable (reversible) or "free" region, and a proximate, magnetically referenced or "fixed" region, arranged into a MTJ device. The term "fixed region" is used broadly herein to denote any type of region which, in cooperation with the free or changeable region, results in a detectable state of the device as a whole.

Generally, the principle underlying storage of data in such cells is the ability to change, and even reverse, the relative orientation of the magnetization of the free regions with respect to the corresponding fixed regions by changing the direction of magnetization along the easy axis ("EA") of the free region, and the ability to thereafter read this relative orientation difference. More particularly, a storage cell is written by reversing the free region magnetization using applied bi-directional electrical and resultant magnetic stimuli via its respective bit line and word line.

The storage cell is later read by measuring the resultant tunneling resistance between the bit line and word line, which assumes one of two values depending on the relative orientation of the magnetization of the free region with respect to the fixed region. If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states, and therefore two possible tunneling resistance values, are defined for the cell: aligned or parallel (+EA/+EA) and anti-aligned or anti-parallel (−EA/+EA).

Figure 2:
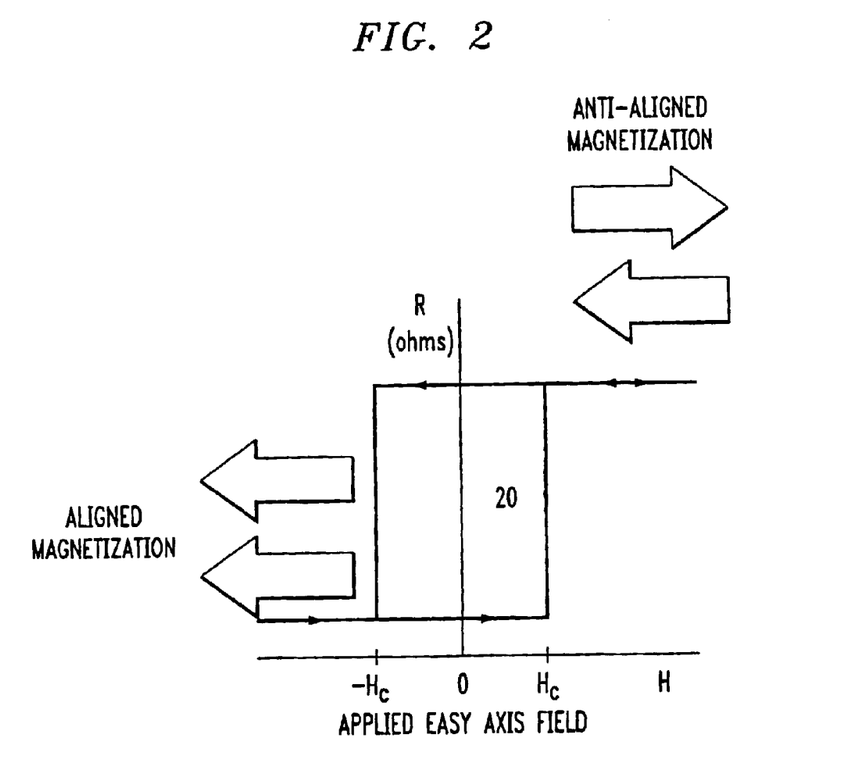
FIG. 2 schematically illustrates an ideal hysteresis loop for a reversible magnetic region of a MRAM storage cell.

An ideal hysteresis loop characterizing the tunnel junction resistance with respect to the applied EA field is shown in FIG. 2. The resistance of the tunnel junction can assume one of two distinct values with no applied stimulus in region 20, i.e., there is a lack of sensitivity of resistance to the applied field below the easy axis flipping field strength +/−$H_c$ in region 20.

For example, if the applied easy axis field exceeds +/−$H_c$, then the cell is coerced into its respective high resistance (anti-aligned magnetization of the free region with respect to the fixed region) or low resistance (aligned magnetization of the free region with respect to the fixed region) state. Thus, in operation as a memory device, the storage cell can be read by measuring the tunneling resistance to infer the magnetization state of the free layer with respect to the fixed layer.

The ideal hysteresis loop, shown schematically in FIG. 2, is desirable since the resistance has one of two distinct possibilities, and there is a lack of sensitivity of measured resistance to the applied field below the flipping field strength $H_c$. However, in a practical device, such ideal behavior often fails to exist, thereby raising many problems.

Figure 3A:
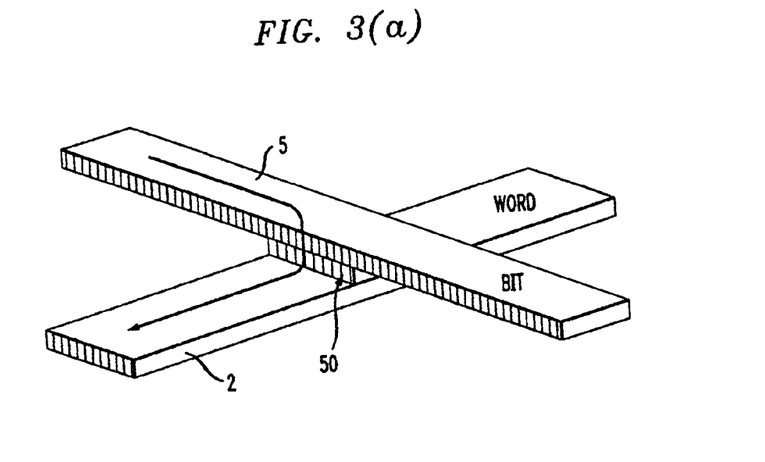
FIGS. 3(a) and 3(b) schematically illustrate a geometry for addressing a MRAM storage cell.
Figure 3B:
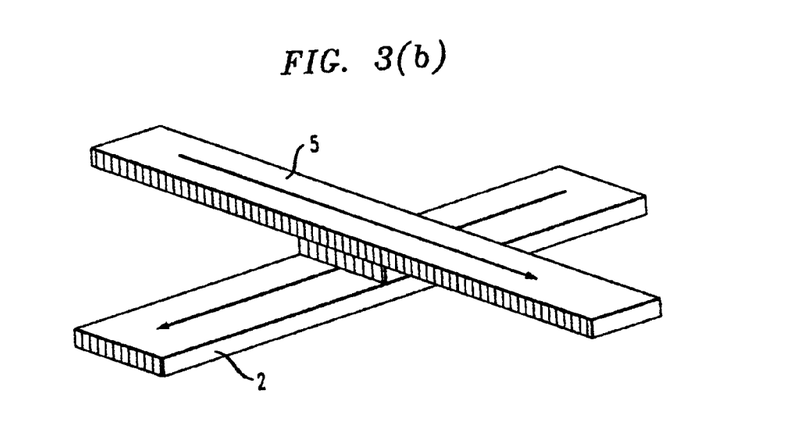

FIGS. 3(a) and 3(b) illustrate a geometry typically proposed for addressing the storage cell 50. The bias current indicated by the arrow through the cell 50 flows from bit line 5 to word line 2, as shown in FIG. 3(a), while the magnetic field-generating current flows in either bit line 5 or word line 2 as indicated by the arrows as shown in FIG. 3(b).

Although the ability to cleanly write the bit (corresponding to the reversal of the free layer in the storage cell geometry discussed above) is important, there is another important aspect for the successful operation of the MRAM array. Specifically, it is desirable to choose, for writing data, only selected memory cells in the array, without disturbing any of the other non-selected cells during this write process.

Figure 4:
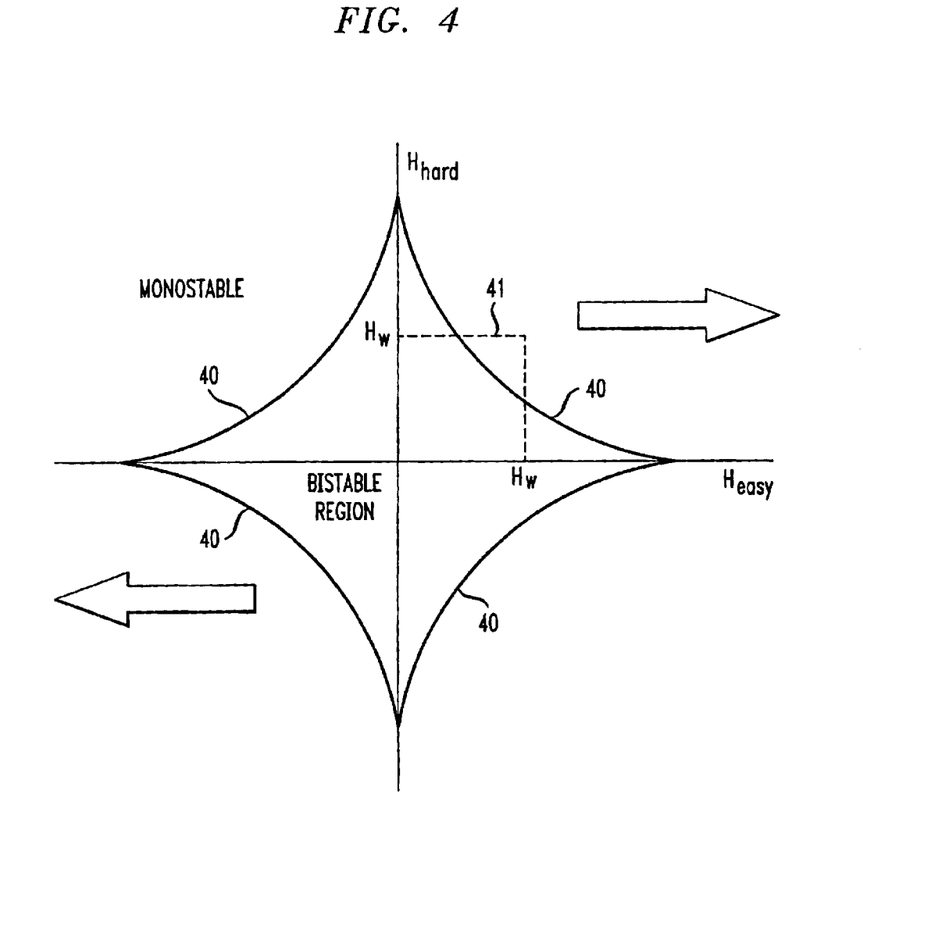
FIG. 4 graphically illustrates the magnetic selectivity of an ideal magnetic memory cell for selectively switching the magnetic state of the memory.

FIG. 4 graphically illustrates the magnetic selectivity of an ideal magnetic memory cell (a so-called "astroid plot" or Stoner-Wolfarth astroid) and selective switching of cells in an array. The solid line 40 traces the boundaries of stability for a single idealized particle for magnetization pointing either left or right as a function of applied magnetic field. The axes of the plot correspond to the easy ($H_{easy}$) and hard ($H_{hard}$) axis fields (i.e., parallel or perpendicular to the direction preferred by the crystalline anisotropy).

Inside the astroid boundary 40, there are two stable states and, depending on magnetic history, either can be achieved. However, outside the astroid, there is only one state of magnetization which is parallel to the applied magnetic field. Because of the shape of the astroid, the magnetic field may be used to isolate a particular data storage cell for writing.

As shown by the dotted lines forming a box 41 in FIG. 4, easy and hard axis fields (generated by currents through the bit and word lines intersecting at a selected cell), each of amplitude $H_w$, force the storage cell into the right-pointing state. Neighboring storage cells, e.g., those either on the same word line or same bit line, having either insufficient easy or hard axis fields within their astroid boundaries are not expected to change state. Thus, in theory, a specific selected device can be written by simultaneously applying current to both the word and bit lines.

The above procedure for writing requires very tight manufacturing tolerances. Specifically, in practice, the solid line 40 of the astroid curve expands into a band when considering the range of stability for a population of junctions. If this band becomes too large, then there is no combination of easy and hard axis fields which will definitely switch any desired storage cell, without also switching other unselected storage cells by mistake. Thus, reliability becomes a problem.

Further, the magnetic field at a storage cell is affected by not only the fields from the bit and word lines, but also to the magnetic state of the storage cells around it. This effect, when considered statistically, further reduces write selectivity.

Generally, the preferred embodiment of the present invention provides a memory array utilizing a memory storage device design in which a write selectivity of a storage cell, e.g., a MTJ, or group of storage cells may be selectively increased by heating only the selected cell(s), thereby reducing the likelihood of unintentionally writing adjacent cells, and improving the quality of the switching characteristics of the selected cell(s).

With reference to FIG. 1, an exemplary memory array includes a set of electrically conductive lines that function as parallel word lines 1, 2, and 3 in a horizontal plane, and a set of electrically conductive lines that function as parallel bit lines 4, 5, and 6 in another horizontal plane. The bit lines are preferably oriented in a different direction, e.g., at right angles to the word lines, so that the two sets of lines form intersecting regions when viewed from above.

Figure 5A:
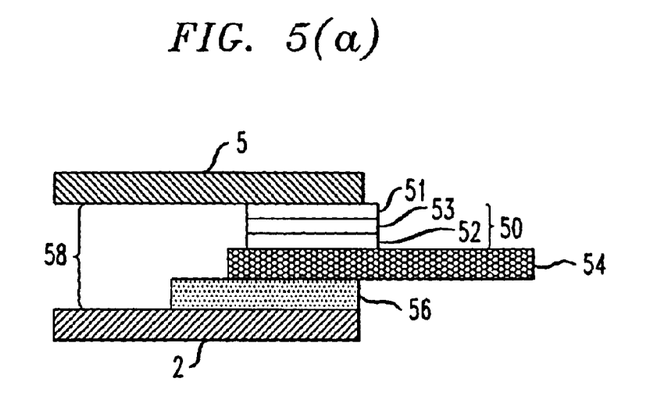
FIG. 5(a) schematically illustrates a memory storage device, formed in accordance with one aspect of the present invention.
Figure 5B:
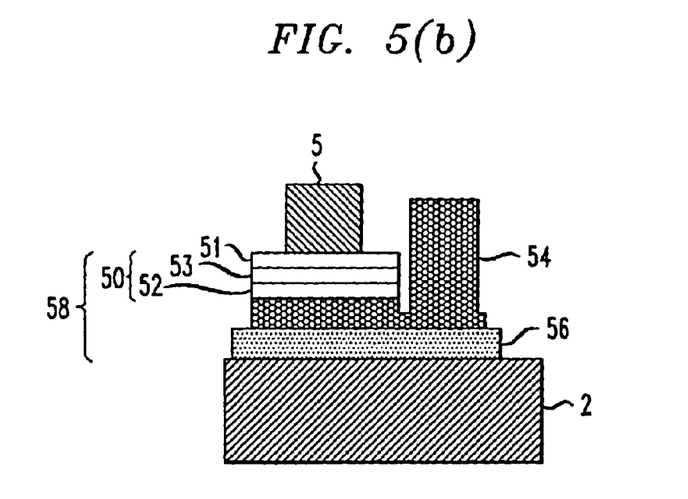
FIG. 5(b) schematically illustrates a memory storage device, formed in accordance with another aspect of the present invention.

A storage cell 50, for example, a MTJ device, which is shown in greater detail in FIGS. 5(a) and 5(b) with regard to the present invention, is located at a plurality of intersecting regions of a word line and a bit line, vertically spaced between the lines. Three word lines and three bit lines are illustrated in FIG. 1, but the number of lines would typically be much larger.

The storage cell 50 will be described in more detail with reference to FIGS. 5(a) and 5(b). Storage cell 50, e.g., a MTJ device, is preferably formed of a number of vertically stacked regions or layers. In particular, cell 50 comprises both a fixed layer 52 and a changeable or "free" layer 51 separated by an electrically insulating tunnel barrier layer 53. As will be understood from the above referenced patents issued to Gallagher et al., the magnetization of fixed layer 52 is oriented in the plane of the layer but is fixed so that it may not be rotated or reversed in the presence of applied external magnetic fields generated by write currents through bit line 5 and word line 2. By contrast, the magnetization of free layer 51 can be rotated (or reversed) in the plane of layer 51 relative to the fixed magnetization of layer 52. The amount of tunneling current that flows perpendicularly through magnetic layers 51 and 52 and through the intermediate tunneling insulating layer 53, e.g., $Al_2O_3$, depends on the relative magnetization directions of magnetic layers 51 and 52.

As will be understood, the free layer 51 is fabricated to have a preferred axis for the direction of magnetization called the easy axis. There are two possible stable reversible directions of magnetization of the free layer 51 along this easy axis which define two stable states of the storage cell 50.

During a memory array operation, the cell 50 can be written by changing the magnetization of the free layer 51. The magnetization of the free layer can be changed, for example, when a sufficiently large current is passed through both a word line 2 and a bit line 5 of the storage cell 50. The field generated by the combined magnetic fields at the intersection of the word and bit lines will rotate the magnetization of the free layer 51 of the single particular cell 50 located at the intersection of the energized word and bit lines. Alternatively, the field generated by current passing through a single word or bit line alone may be sufficient to rotate the magnetization of the free layer 51 of the cell 50 when the cell 50 is selected as further described below. The current levels are designed so that the field produced exceeds the switching field of the free layer 51. The storage cell 50 is designed so that the field required to switch the magnetization of the fixed layer 52 is much greater than the field required to switch the free layer 51. Another example of changing the magnetization of the free layer is via spin injection, wherein the spin state of the electrons of current passing through the cell operatively affects the magnetization of the free layer.

The state of the storage cell 50 may be determined, for example, by measuring the resistance of the storage cell 50 when a read current, much smaller than the write current, is passed perpendicularly through the cell. The field generated by this read current is preferably negligible and therefore does not switch the magnetic state of storage cell 50.

In U.S. patent application Ser. No. 09/708,253 entitled, "Thermally-Assisted Magnetic Random Access Memory (MRAM)," filed Nov. 8, 2000, incorporated herein by reference, the inventors of the instant application disclosed the use of heat to help selectively write an MTJ device within a memory device. In the previously filed invention, a pulse of current is applied by a voltage source such that the current passes through a selected cell to directly heat the reversible magnetic layer of the selected cell. This heating serves to isolate the device to be addressed, thus improving write selectivity and improving the quality of the switching characteristics.

It has been found that when the selected cell 50 is heated by a predetermined amount, e.g., 50–100° C., the magnetic field required to switch that specific cell can be reduced. If the magnetic field is applied simultaneously, or at least before the layer 51 recools, only the heated cell will be written, provided that the magnetic field strength is both larger than the coercivity of the heated cell and smaller than the coercivity of the unheated cell.

The present invention provides a memory storage device 58 that removes the heating function from the storage cell 50, thereby removing constraints on the choice of storage cells, e.g., tunnel barriers having a certain range of resistance. In addition, the memory storage device of the invention can remove possible limits on the available densities of the memory array.

As shown in FIGS. 5(a) and 5(b), the memory storage device 58 of the invention includes a heating element 56 and a storage cell 50 as described above. The heating element 56 is separate from the storage cell 50 and preferably comprises a conductive layer having a low resistance, e.g., from about 1 to about 100 ohms, in order to permit sufficient heat to be generated by a given electric current passing through the heating element 56. Suitable materials for forming the heating element layer 56 include, for example, tungsten, copper, aluminum, and doped silicon.

The heating element 56 is heated by an external energy source (not shown). The energy source can be, for example, a voltage or current source, or a heat source. As shown in FIGS. 5(a) and 5(b), electric current can pass through the word line 2 into the heating element 56. Although other configurations are possible, it is preferred that the heating element 56 be heated by current passing from an adjacent word line.

In a preferred embodiment, the memory storage device 58 of the invention also includes an output terminal 54. The output terminal 54 can be formed of any conventional material, such as metal, suitable for carrying current. It is preferred that the conductive terminal 54 not be magnetic. The output terminal 54 can accept current passing through the heating element 56 and serve as a return to an external voltage or current source that provided the current.

FIGS. 5(a) and 5(b) show two preferred arrangements of the elements within the memory device 58, and the coupling of the memory device 58 to the word lines 2 and bit lines 5 in a memory array. As shown in FIGS. 5(a) and 5(b), in a preferred arrangement of the memory array, the heating element 56 is adjacent to the word line 2. However, other arrangements are possible. For example, the word and bit lines could be reversed. Regardless of the specific arrangement of the memory array or the memory storage device 58 within the array, the heating element 56 should be proximate to the storage cell 50 such that the heat from the heating element 56 can be substantially localized to the selected storage cell 50, thereby raising the temperature of the storage cell 50 without also heating adjacent storage cells.

Due to heating of the storage cell 50 as described above, the coercive field is reduced in the storage cell 50. Therefore, a much smaller magnetic field can be applied to reverse the direction of magnetization in the free layer 51. In contrast, during the read process, a smaller current is typically used, whereby the reading operation leaves the stored magnetization state intact. As will be understood, such thermally assisted switching ensures that when the cell is not activated (e.g., heated), the cold-state coercivity is comparatively large and thus unintentional switching is minimized.

In a preferred embodiment, the free layer 51 of storage cell 50 includes ferrimagnetic material. As is well known, ferrimagnetic materials often include a plurality (e.g., two) of sub-lattices with opposing magnetization. However, contrary to the case of an anti-ferromagnet, because the two sub-lattices in a ferromagnet are not identical, the physical properties of a ferromagnet are quite different from those of an anti-ferromagnet. Ferromagnetism is usually observed in rare earth alloys such as those indicated in FIGS. 6(a)–(c).

Examples of ferrimagnetic materials include alloys of Fe and at least one of Gd, Tb, and Dy, e.g., $Gd_{23}Fe_{77}$, $Gd_{24}Fe_{76}$, $Tb_{19}Fe_{81}$, $Tb_{21}Fe_{79}$, $Dy_{17}Fe_{83}$, and $Dy_{21}Fe_{79}$. Other examples of ferrimagnetic materials include alloys of Co and Sm.

Usually, the moments of the two sub-lattices of ferrimagnetic materials are unequal so that there is a net macroscopic moment. The magnetizations of the sub-lattices have different temperature dependence so that there can be a temperature at which they exactly compensate for one another. At the compensation temperature ($T_{comp}$), the coercivity is very high as there is no net moment to be rotated by an externally applied magnetic field. Small changes in temperature close to the compensation point can lead to dramatic changes in coercivity, as shown in FIGS. 6(a)–6(c). Depending on how tightly the operating temperature is controlled, changes of as little as about 5° C. to about 10° C. can provide an order of magnitude change in the coercive external magnetic field.

As a related issue, temperature control may be provided for the storage cell to more precisely define the hot and cold coercive fields, using, for example, the guidance of graphs such as those shown in FIGS. 6(a)–6(c). With more precise control of the operating temperature, less heating would be required since the chip then could operate closer to the compensation temperature where the rate of change of coercive field with temperature increases.

Estimates of temperature rise depend on the materials used, and the specific geometry of the MRAM cell. However, several simple models provide temperature rises in the range of a few tens of degrees Celsius for micron-sized junctions, resistances of 1K ohms and a voltage bias of 1 volt (V). The temperature rises further as dimensions in the memory array are shrunk, so that scalability is feasible.

The speed of the thermal selection process is also expected to be quite rapid. For example, other experiments on small geometries (e.g., see Williams et al., "Scanning Thermal Profiler," Appl. Phys. Lett. 23, pp. 1587–1589, incorporated herein by reference), have shown thermal time constants in some cases to be shorter than 1 nanosecond (ns). As discussed in Mee et al., "Magnetic Recording Handbook," McGraw-Hill, pp. 540–580 (1989), incorporated herein by reference, the lateral diffusion time constant for heat to propagate in metallic films would be on the order of 1 ns. Hence, the selection process of heating a junction need not be the rate-limiting element in an MRAM array.

In another embodiment, an integrated circuit is provided. As will be understood (e.g. from U.S. Pat. Nos. 5,650,958 and 5,640,343 issued to Gallagher et al.) while not shown in FIGS. 5(a) and 5(b), the memory storage device 58 of the memory array may be formed on a substrate, such as a silicon substrate on which there may be included other circuitry to form an integrated circuit. The integrated circuit of the invention includes a memory storage device as described above.

Thus, a robust means is provided for choosing which memory storage cell are to be written, and for minimizing unintentional switching of other adjacent cells in a memory array. Moreover, a potentially large change in coercivity is made possible, and hence a larger write select margin is provided. Additionally, with thermally-assisted switching, when the cell is not heated, the cold-state coercivity is large and unintentional switching is reduced. Thus, intrinsic crosstalk, as well as external fields, are minimized, and shielding requirements are decreased, to result in a smaller or more dense overall structure of MRAM arrays. In addition, by providing a heating layer that is separate from the cell to be heated, the limitations on the resistivity of the cell are removed, thereby allowing further flexibility in cell manufacture.

While the invention has been described in terms of several preferred embodiments, those skilled in the art will recognize that the invention can be practiced with modifications, within the spirit and scope of the appended claims.

We claim:

1. A memory storage device comprising:
   a) a storage cell comprising a changeable magnetic region, said changeable magnetic region comprising a material having a magnetization state that is responsive to a change in temperature thereof; and
   b) a heating element proximate to said storage cell for selectively changing the temperature of said changeable magnetic region of said storage cell.

2. The memory storage device of claim 1, wherein said storage cell comprises a magnetic tunnel junction.

3. The memory storage device of claim 1, wherein said changeable magnetic region is a reversible magnetic region having a magnetization state which can be reversed by applying thereto a selected magnetic field, said reversible magnetic region comprising a material having a magnetization state that is responsive to a change in the temperature thereof.

4. The memory storage device of claim 3, wherein said storage cell further comprises at least one fixed magnetic region having a magnetization state which does not reverse when said selected magnetic field is applied thereto.

5. The memory storage device of claim 1, wherein said heating element is heated by passing an electric current therethrough.

6. The memory storage device of claim 5, further comprising an electrically conductive terminal capable of receiving the electric current passing through said heating element.

7. The memory storage device of claim 1, wherein said material having a magnetization state that is responsive to a change in temperature thereof comprises a ferrimagnetic material.

8. The memory storage device of claim 7, wherein said changeable magnetic region is maintained at a compensation temperature of said material to maintain stored data in said storage cell.

9. A memory storage device comprising:
   a) a storage cell comprising a changeable magnetic region, said changeable magnetic region comprising a material having a magnetization state that is responsive to a change in temperature thereof; and
   b) a heating element responsive to an external energy source and proximate to said storage cell for selectively changing the temperature of said changeable magnetic region of said storage cell.

10. A memory array comprising two or more memory storage devices, at least one of said memory storage devices comprising:
    a) a storage cell having a bit line and word line associated therewith, said storage cell comprising a changeable magnetic region, said changeable magnetic region comprising a material having a magnetization state that is responsive to a change in temperature thereof; and
    b) a heating element proximate to said storage cell for selectively changing the temperature of said changeable magnetic region of said storage cell.

11. The memory array of claim 10, wherein said storage cell comprises a magnetic tunnel junction.

12. The memory array of claim 10, wherein said changeable magnetic region is a reversible magnetic region having a magnetization state which can be reversed by applying thereto a selected magnetic field, said reversible magnetic region comprising a material having a magnetization state that is responsive to a change in temperature thereof.

13. The memory array of claim 12, wherein said storage cell further comprises at least one fixed magnetic region having a magnetization state which does not reverse when said selected magnetic field is applied thereto.

14. The memory array of claim 10, wherein said heating element is heated by passing an electric current therethrough.

15. The memory array of claim 14, wherein said at least one of said memory storage devices further comprises an electrically conductive terminal capable of receiving the electric current passing through said heating element.

16. The memory array of claim 14, wherein said electric current is passed through said heating element for a predetermined time period, wherein said time period is sufficiently short so as to prevent reversal of a magnetization state of one or more storage cells adjacent to the selected storage cell.

17. The memory array of claim 10, wherein said material having a magnetization state that is responsive to a change in temperature thereof comprises a ferrimagnetic material.

18. The memory array of claim 10, wherein said changeable magnetic region is maintained at a compensation temperature of said material to maintain stored data in said storage cell.

19. An integrated circuit comprising at least one memory storage device, said memory storage device comprising:
   a) a storage cell comprising a changeable magnetic region, said changeable magnetic region comprising a material having a magnetization state that is responsive to a change in temperature thereof; and
   b) a heating element proximate to said storage cell for selectively changing the temperature of said changeable magnetic region of said storage cell.

20. The integrated circuit of claim 19, wherein said at least one memory storage device further comprises an electrically conductive terminal capable of receiving an electric current passing through said heating element.

* * * * *

UNITED STATES PATENT AND TRADEMARK OFFICE
CERTIFICATE OF CORRECTION

PATENT NO.       : 6,724,674 B2                                  Page 1 of 1
APPLICATION NO. : 10/128838
DATED            : April 20, 2004
INVENTOR(S)      : Abraham et al.

It is certified that error appears in the above-identified patent and that said Letters Patent is hereby corrected as shown below:

On Title Page add:

Related U.S. Application Data:
"Continuation-in-part of Application No. 708,253, filed on Nov. 8, 2000, Patent No. 6,385,082 B1."

In column 1 after the title add:

"This appliation is a Continuation-in-part of Application No. 708,253, filed on Nov. 8, 2000, Patent No. 6,385,082 B1."

Signed and Sealed this

Twenty-fifth Day of July, 2006

JON W. DUDAS
*Director of the United States Patent and Trademark Office*